United States Patent [19]
Gauthier, Jr. et al.

[11] Patent Number: 6,049,445
[45] Date of Patent: Apr. 11, 2000

[54] OVERVOLTAGE AND ELECTROSTATIC DISCHARGE PROTECTION FOR A RECEIVER CIRCUIT

[75] Inventors: Robert J. Gauthier, Jr., Hinesburg; Steven H. Voldman, South Burlington, both of Vt.

[73] Assignee: International Business Machines Corporation, Armonk, N.Y.

[21] Appl. No.: 09/156,111

[22] Filed: Sep. 18, 1998

[51] Int. Cl.[7] ..................................................... H02H 9/04
[52] U.S. Cl. .......................... 361/56; 361/91.5; 327/328
[58] Field of Search .......................... 361/91.1, 56, 91.5, 361/86, 111, 118, 119; 327/310, 327, 328; 257/357, 358

[56] References Cited

U.S. PATENT DOCUMENTS

| | | |
|---|---|---|
| 4,922,371 | 5/1990 | Gray et al. . |
| 4,937,700 | 6/1990 | Iwahashi ................................... 361/91 |
| 5,333,093 | 7/1994 | Krautschneider et al. ............... 361/56 |
| 5,576,635 | 11/1996 | Partovi et al. . |
| 5,591,992 | 1/1997 | Leach . |
| 5,637,892 | 6/1997 | Leach . |
| 5,784,242 | 7/1998 | Watt ....................................... 361/111 |
| 5,793,592 | 8/1998 | Adams et al. ............................ 361/90 |
| 5,815,354 | 9/1998 | Braceras et al. ......................... 361/56 |
| 5,852,540 | 12/1998 | Haider .................................... 361/111 |
| 5,859,442 | 1/1999 | Manning ................................. 257/48 |

*Primary Examiner*—Jeffrey Gaffin
*Assistant Examiner*—Kim Huynh
*Attorney, Agent, or Firm*—Ratner & Prestia; Eugene I. Shkurko

[57] ABSTRACT

A receiver circuit that is substantially insensitive to overvoltage and electrostatic discharge (ESD) conditions. The receiver circuit includes a pass transistor having an input side for receiving a signal, an output side, and a gate susceptible to damage when an ESD potential is present. A receiver is coupled to the output side of the pass transistor to receive the signal. A first protection circuit has a first rail, providing an operating voltage potential to the gate of the pass transistor, and structure that electrically decouples the first rail from the gate of the pass transistor. The first protection circuit provides (1) the operating voltage potential to the gate when an ESD potential is not present, and (2) a voltage which tracks the ESD potential when the ESD potential is present at the input side of the pass transistor. A second protection circuit has a first mechanism for providing a test signal voltage to the output side of the pass transistor and a second mechanism for electrically decoupling the output side of the pass transistor. The second protection circuit provides (1) the test signal voltage to the output side of the pass transistor when an ESD potential is not present, and (2) a voltage which tracks the ESD potential when the ESD potential is present at the input side of the pass transistor. A resistor and a clamping transistor may also be added to the receiver circuit to provide additional robust structure guarding against overvoltage or ESD conditions.

19 Claims, 3 Drawing Sheets

OVERVOLTAGE AND ELECTROSTATIC DISCHARGE PROTECTION FOR A RECEIVER CIRCUIT

TECHNICAL FIELD

The present invention relates, in general, to high-speed integrated circuit (IC) chips which experience large changes in current or voltage from external signals and, more specifically, to providing protection from overvoltage and electrostatic discharge (ESD) to a receiver circuit containing metal-oxide semiconductor field-effect transistors (MOSFETs).

BACKGROUND OF THE INVENTION

MOSFETs are vulnerable to ESD voltages as a consequence of the environment in which they operate. This vulnerability is due to the thinness of the gate oxide layer of the MOSFET device. The thinness of the layer is a desired necessity for achieving fast MOSFET devices. Typically, a conventional MOSFET device will have a gate oxide thickness of approximately 60 Angstroms, resulting in an oxide breakdown voltage of approximately 5 to 6 volts. ESD voltages may easily reach several hundred volts, however, and such ESD voltages can severely degrade—if not destroy—the affected MOSFET device.

Furthermore, as a result of the continued scaling and shrinking of semiconductor devices, IC chips have progressively become smaller and denser. To facilitate these highly integrated semiconductor devices, the typical supply voltage of 5 volts has been reduced to a voltage level less than 5 volts, commonly from about 3.6 volts to as low as 2.5 volts.

Often a mix of ICs is used on the same printed circuit (PC) board. Some of the ICs are designed to use a standard supply of 5 volts and other ICs on the PC board are designed to use a much lower voltage level. This mix creates a problem of possible overvoltage conditions, when a voltage level higher then the supply voltage level of the IC is presented at the pad of that IC. When a high-voltage IC feeds into a low-voltage IC, the low-voltage IC may encounter excessive voltage stresses in the thin oxide layers of some of the semiconductor devices in the circuitry interfacing between the ICs.

Pass transistors have been designed to handle overvoltage conditions and to protect receiver circuits. Such a circuit is shown in FIG. 1. As shown, prior art circuit 10 comprises pass transistor 14, which is an n-channel MOSFET, connected between pad 24 and receiver 18. The gate of pass transistor 14 is coupled to supply voltage 12, $V_{DD}$. Receiver 18 also has the drain of keeper MOSFET 16, which is a p-channel MOSFET, connected to its input node 26. Output node 20 of receiver 18 is coupled to the gate of keeper MOSFET 16. The source of keeper MOSFET 16 is coupled to supply voltage 12. To those familiar with the art, keeper MOSFET 16 may also be referred to as a boost transistor or half-latch transistor.

Generally, a high signal voltage level is at about $V_{DD}$ and a low signal voltage level is at about $V_{SS}$, or ground. In normal operation, when supply voltage $V_{DD}$ is "on," a high signal voltage level at pad 24 generates a "weak" high at node 26. The "weak" high is caused by the threshold voltage drop across the input and output sides of pass transistor 14. The voltage level may be brought back up to $V_{DD}$ at node 26 by keeper MOSFET 16. A low signal level at node 20 turns on p-channel MOSFET 16, which then latches node 26 to $V_{DD}$. Consequently, any overvoltage condition at pad 24 is absorbed by the threshold voltage drop across the pass transistor 14.

Because node 26 is latched to $V_{DD}$ when MOSFET 16 is on, an overvoltage condition or an ESD condition at pad 24 stresses pass transistor 14. Furthermore, an ESD condition at pad 24 stresses pass transistor 14 even when MOSFET 16 is off. During its off state, n-well 22 is at $V_{DD}$ potential and the drain of MOSFET 16 at node 26 is at a single diode voltage drop away from $V_{DD}$. When node 26 rises one diode voltage drop above n-well 22, node 26 is effectively pinned to a voltage potential of $V_{DD}$ plus one diode voltage drop. The pinning of node 26 stresses pass transistor 14 during an overvoltage or ESD condition at pad 24.

Stress problems potentially exist even when the circuit of FIG. 1 is unpowered. If $V_{DD}$ is at ground potential, node 26 is pinned, nevertheless, to a voltage potential of one divide voltage drop above ground potential. Again, an ESD condition at pad 24 may stress pass transistor 14. From the above discussion, it is seen that an improved receiver circuit that is tolerant to overvoltage and ESD conditions is needed.

SUMMARY OF THE INVENTION

To meet this and other needs, and in view of its purposes, the present invention provides a receiver circuit that is substantially insensitive to overvoltage and ESD conditions. In one embodiment, the receiver circuit includes a pass transistor having an input side for receiving a signal, an output side, and a gate susceptible to damage when an ESD potential is present. A receiver is coupled to the output side of the pass transistor to receive the signal. A first protection circuit has a first rail, providing an operating voltage potential to the gate of the pass transistor, and structure that electrically decouples the first rail from the gate of the pass transistor. The first protection circuit provides (1) the operating voltage potential to the gate when an ESD potential is not present, and (2) a voltage which tracks the ESD potential when the ESD potential is present at the input side of the pass transistor.

The receiver circuit also may include a second protection circuit having a first mechanism for providing a test signal voltage to the output side of the pass transistor and a second mechanism for electrically decoupling the output side of the pass transistor from the test signal voltage. The second protection circuit provides (1) the test signal voltage to the output side of the pass transistor when an ESD potential is not present, and (2) a voltage which tracks the ESD potential when the ESD potential is present at the input side of the pass transistor. A resistor and a clamping transistor may also be added to the receiver circuit to provide additional robust structure guarding against overvoltage or ESD conditions.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
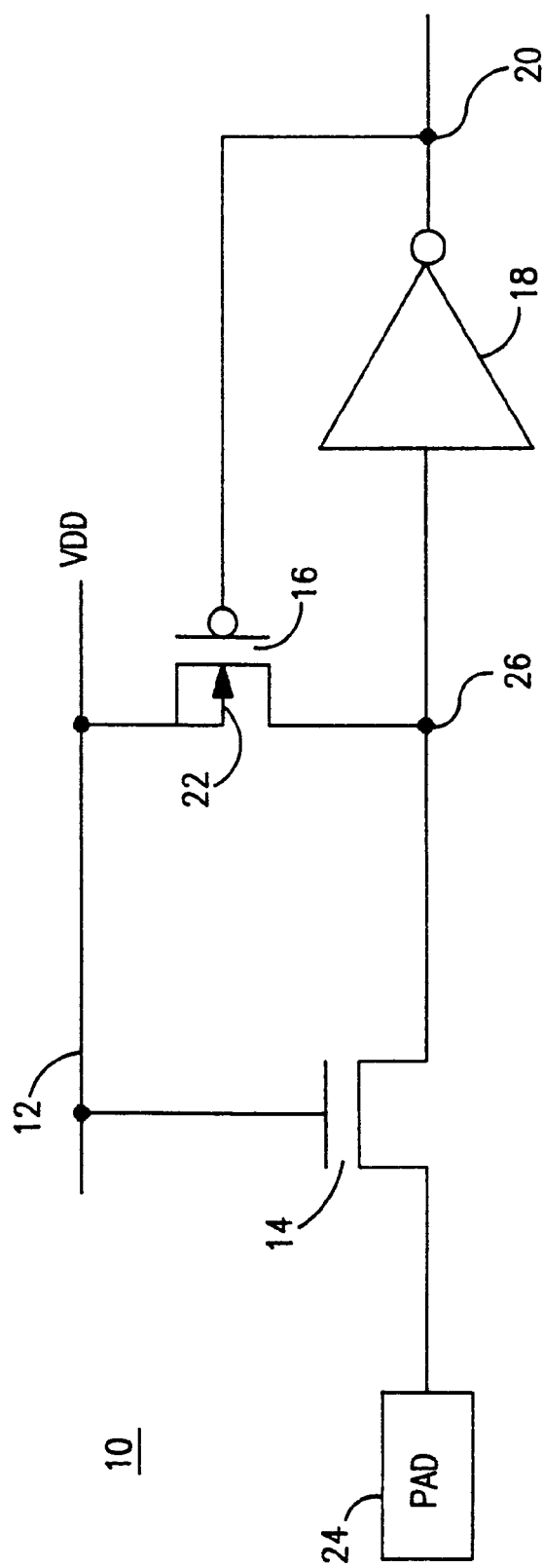
FIG. 1 is a schematic diagram of a prior art receiver circuit.
Figure 2:
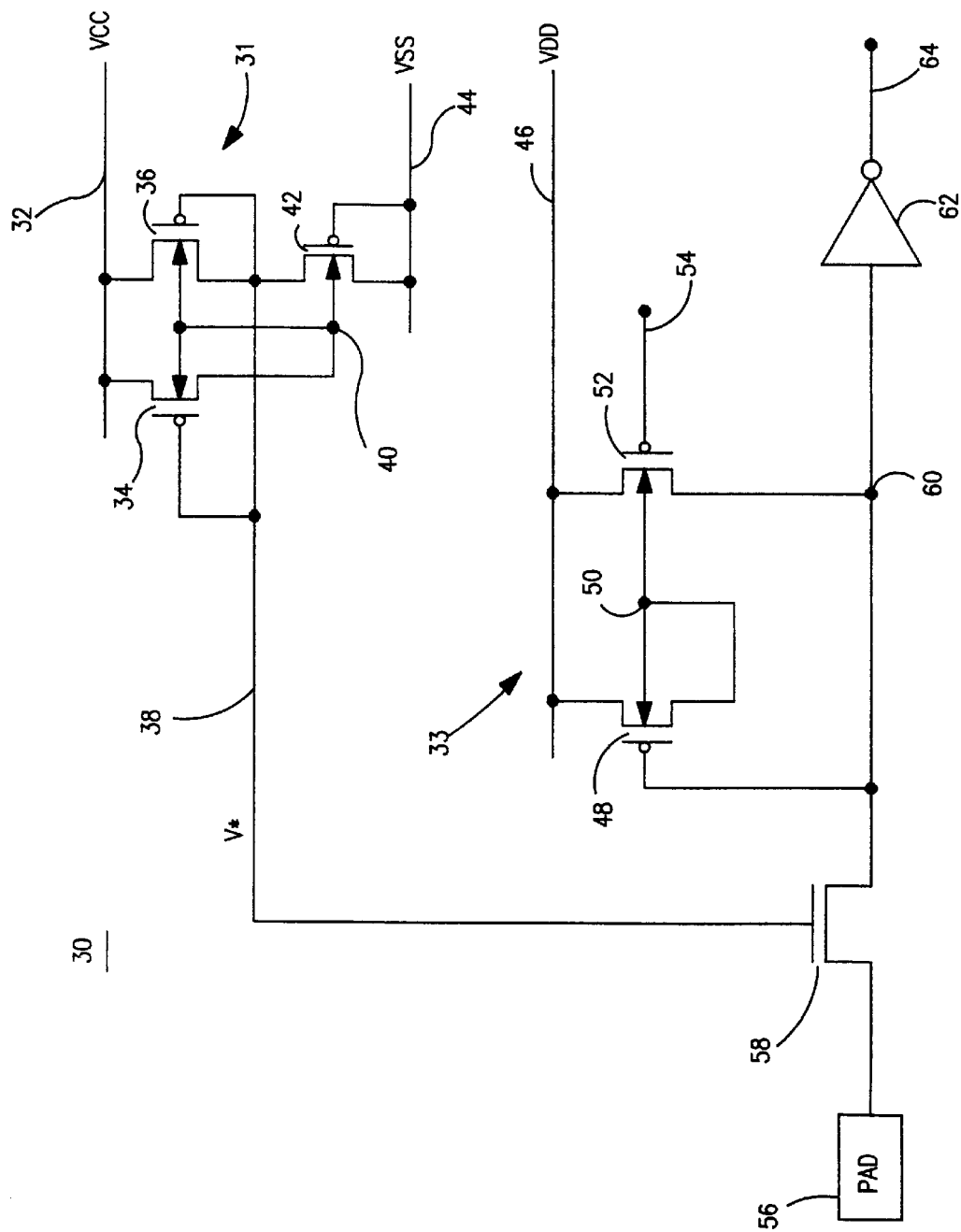
FIG. 2 is a schematic diagram of a receiver circuit according to a first embodiment of the present invention.

FIG. 2 is a circuit diagram of a first embodiment of a receiver circuit according to the present invention. As shown, receiver circuit 30 comprises pass transistor 58 connected between pad 56 and receiver 62. Receiver 62 has an input at node 60 and an output at node 64. The gate of pass transistor 58 is serviced by first protection circuit 31, which provides a voltage-tolerant voltage divider network; protection circuit 31 is comprised of three p-channel MOSFETs, namely MOSFET 34, MOSFET 36, and MOSFET 42. As explained below, MOSFETs 36 and 42 are voltage dividers which provide a potential V* at first rail 38.

The voltage dividers are coupled between second rail 32, which provides $V_{CC}$ potential, and third rail 44, which provides $V_{SS}$ potential. MOSFET 34 is a well bias controller for the voltage dividers. The drain of MOSFET 34 is connected through node 40 to the n-wells of all the MOSFETs in first protection circuit 31, namely MOSFETs 34, 36, and 42.

Also shown in FIG. 2 is second protection circuit 33 which is comprised of two p-channel MOSFETs, namely MOSFET 48 and MOSFET 52. As explained below, MOSFET 52 provides an Iddq test function and MOSFET 48 is a second well bias controller. It will be appreciated that MOSFET 52 may provide a different switching function; for exemplary purpose, however, MOSFET 48 provides the Iddq test function. The source of each MOSFET 48 and 52 is connected to a fourth rail 46, which provides $V_{DD}$ potential. The gate of MOSFET 52 is connected to test pin 54 for receiving the Iddq test enable signal. Finally, the gate of MOSFET 48 is connected to node 60, the input to receiver 62; the drain of MOSFET 48 is connected to the n-wells of MOSFETs 48 and 52 at node 50.

The operation of first protection circuit 31 will now be explained. During normal operation, second rail 32 is at $V_{CC}$ potential and third rail 44 is at $V_{SS}$ potential. $V_{SS}$ potential is lower then $V_{CC}$, and may be at ground potential. MOSFETs 36 and 42 are coupled between the second rail 32 and third rail 44.

Due to the voltage divider actions of MOSFETs 36 and 42, V* is at a lower potential than $V_{CC}$ and at a higher potential than $V_{SS}$. Because the gate of MOSFET 34 is at V* potential and the source of MOSFET 34 is at the higher potential of $V_{CC}$, p-channel MOSFET 34 is also on. Consequently, the drain of MOSFET 34 is near the potential of $V_{CC}$. The n-wells are also at the potential of $V_{CC}$, and forward biasing of these transistors does not occur, because the n-wells of p-channel MOSFETs 34, 36, and 42 are connected to the drain of MOSFET 34.

Next the operation of first protection circuit 31 is explained during an unpowered condition of receiver circuit 30, and during an overvoltage of an ESD environment. As will be appreciated by those skilled in the art, when an overvoltage or ESD occurs at pad 56, the gate of pass transistor 58, an n-channel MOSFET, may rise to a high potential. The cause of such high potential is a large parasitic capacitance that exists between the input side of pass transistor 58 and the gate of pass transistor 58. As the gate of pass transistor 58 rises, the source of MOSFET 42 also rises and the n-well of MOSFET 42 also rises to one diode voltage drop relative to its source.

Assuming that second rail 32 is at a ground potential, MOSFETs 34 and 36 are both off as the potential of first rail 38 rises, and the n-wells of MOSFETs 34 and 36 rise to the same potential as the n-well of MOSFET 42. Thus, all the n-wells in first protection circuit 31 track the potential of first rail 38. Furthermore, because first well bias controller or MOSFET 34 is off when the potential of first rail 38 rises, the n-wells are permitted to track the potential of first rail 38.

When the n-wells track the potential of the first rail 38, the diodes in MOSFETs 36 and 42 do not turn on at all and, consequently, the potential of the n-wells moves with the potential of first rail 38.

In summary, in accordance with one embodiment of the present invention, first well bias controller (MOSFET 34) decouples the n-well node from second rail 32, allowing the n-well node to float. Because the n-well node floats, there is no continuous current flow out of first rail 38 and the potential of the gate of pass transistor 58 moves or tracks with input pad 56. Consequently, the dielectric voltage stress on pass transistor 58 is reduced.

Turning next to second protection circuit 33, its operation will now be explained. During test operation of receiver circuit 30, the Iddq test enable signal is provided to test pin 54, which places the gate of the Iddq test function transistor (MOSFET 52) at a ground potential. Because the source of MOSFET 52 is at the higher potential of $V_{DD}$, MOSFET 52 is on and its drain voltage at node 60 at $V_{DD}$. In addition, because the gate of the second well bias controller (MOSFET 48) has a lower potential than fourth rail 46, the bias controller is on. This condition forces the n-wells of MOSFETs 48 and 52 to rise to $V_{DD}$. In situations when the gate of MOSFET 48 is at a higher potential than $V_{DD}$, MOSFET 48 turns off and the n-wells of MOSFETs 48 and 52 track node 60 to within one diode voltage drop.

In the case of an unpowered condition of receiver circuit 30 and an ESD potential placed on pad 56, fourth rail 46 may be at a ground potential and node 60 may start rising. MOSFET 48 is off in this circumstance, and the potential of the n-wells of MOSFETs 48 and 52 rise together with the potential of node 60. Consequently, the pinning of node 60 is prevented, reducing the dielectric voltage stress across pass transistor 58.

In summary, in accordance with another aspect of the present invention, second well bias controller (MOSFET 48) decouples the n-well node from fourth rail 46, allowing the n-well node to float. In this manner, node 60 may also float and move with any overvoltage or ESD potential preset on the output side of pass transistor 58, due to voltage punch-through or snap-back conditions in pass transistor 58.

Figure 3:
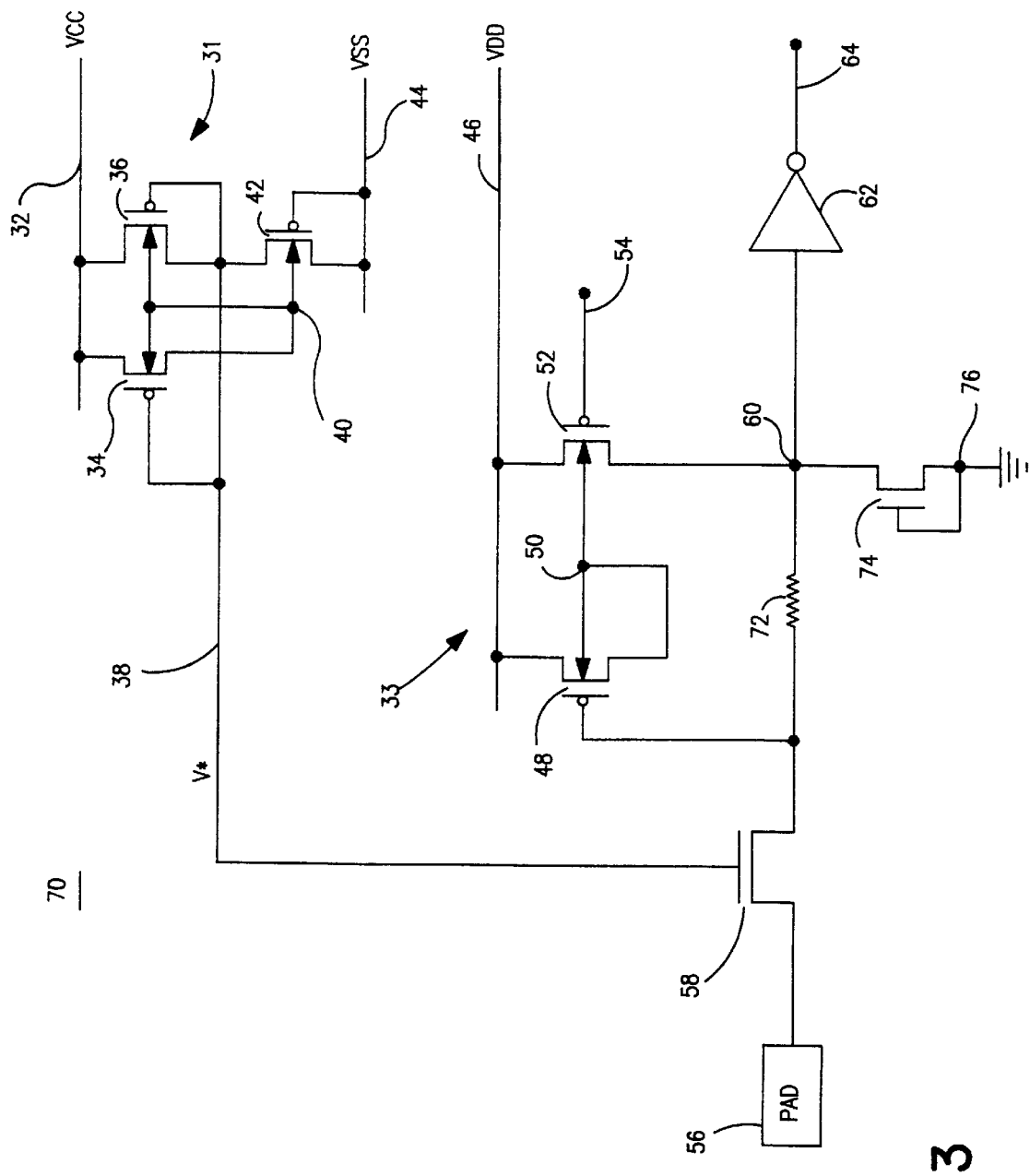
FIG. 3 is a schematic diagram of a further embodiment of the present invention.

FIG. 3 shows another embodiment of the present invention. Shown is receiver circuit 70, which has first protection circuit 31 and second protection circuit 33 each of which is similar to the respective protection circuits shown in FIG. 2. (Like reference numerals refer to like elements throughout the drawing.) Added to resistor circuit 70 in FIG. 2 is a resistor 72 and an n-channel MOSFET 74 connected in series between the output of pass transistor 58 and the input side of receiver 62, at node 60. N-channel MOSFET 74 is connected between node 60 and ground terminal 76. The gate of MOSFET 74 is also connected to ground terminal 76.

It will be appreciated that resistor 72 and MOSFET 74 provide additional robust structure guarding against overvoltage or ESD conditions at pad 56. Any rise in potential at the output side of pass transistor 58, resulting from an overvoltage or ESD condition at pad 56, may be dissipated to ground across resistor 72 and MOSFET 74. It will further be appreciated that MOSFET 74 is an overvoltage clamp. It dynamically clamps node 60 to a fixed voltage level above ground potential. The fixed voltage level is the MOSFET snap-back voltage or punch-through voltage of MOSFET 74.

Although illustrated and described herein with reference to certain specific embodiments, the present invention is nevertheless not intended to be limited to the details shown.

Rather, various modifications may be made in the details within the scope and range of equivalents of the claims and without departing from the spirit of the invention. It will be understood, for example, that the present invention is not limited to only the receiver single circuit described herein. Rather, the invention may be extended to other types of receivers, such as differential receivers.

What is claimed:

1. A receiver circuit in an electrostatic discharge (ESD) environment comprising:
   a pass transistor having an input side receiving a signal, an output side, and a gate susceptible to damage when an ESD potential is present;
   a protection circuit having:
      (a) a first rail providing an operating voltage potential to the gate of the pass transistor;
      (b) a second rail providing $V_{CC}$ voltage potential;
      (c) a third rail providing $V_{SS}$ voltage potential; and
      (d) means for electrically decoupling the first rail from the second rail and the third rail;
   wherein the protection circuit provides (1) the operating voltage potential to the gate when an ESD potential is not present, and (2) a voltage which tracks the ESD potential when the ESD potential is present at the input side of the pass transistor.

2. The receiver circuit of claim 1 wherein the protection circuit further has:
   a voltage divider providing the operating voltage potential and being coupled between the second rail and the third rail; and
   a first well bias controller coupled between the voltage divider and the first rail for adjusting the potential of the first rail when the ESD potential is present.

3. The receiver circuit of claim 2 further comprising a first node and wherein:
   the voltage divider further includes:
      (a) a first p-channel MOSFET having a source connected to the second rail, a drain connected to the first rail, a gate connected to the first rail, and an n-well connected to the first node, and
      (b) a second p-channel MOSFET having a source connected to the first rail, a drain and a gate connected to the third rail, and an n-well connected to the first node; and
   the first well bias controller further includes a third p-channel MOSFET having a drain and an n-well connected to the first node, a source connected to the second rail, and a gate connected to the first rail.

4. The receiver circuit of claim 3 wherein the third p-channel MOSFET is on when the operating voltage potential is provided to the gate of the pass transistor and is off when the ESD potential is above the operating voltage potential.

5. The receiver circuit of claim 4 wherein the first node tracks the voltage potential on the first rail.

6. The receiver circuit of claim 5 wherein the pass transistor is an n-channel MOSFET.

7. A receiver circuit in an electrostatic discharge (ESD) environment comprising:
   a pass transistor having an input side receiving a signal and an output side, the pass transistor susceptible to damage when an excessive potential is present across the input and output sides;
   a receiver coupled to the output side of the pass transistor for receiving the signal;
   a protection circuit having:
      (a) test enable means for providing a test signal voltage to the output side of the pass transistor, and
      (b) means for electrically decoupling the output side of the pass transistor;
   wherein the protection circuit provides (1) the test signal voltage to the output side of the pass transistor when an ESD potential is not present, and (2) a voltage which tracks the ESD potential when the ESD potential is present at the input side of the pass transistor.

8. The receiver circuit of claim 7 further comprising a rail providing $V_{DD}$ voltage potential and wherein the test enable means further includes:
   a first p-channel MOSFET coupled between the rail and the output side of the pass transistor; and
   a well bias controller coupled between the first p-channel MOSFET and the output side of the pass transistor for adjusting the potential of the output side of the pass transistor when the ESD potential is present.

9. The receiver circuit of claim 8 further comprising a test pin and a node and wherein:
   the first p-channel MOSFET has a source connected to the rail, a drain connected to the output side of the pass transistor, a gate connected to the test pin for providing a test enable signal, and an n-well connected to the node; and
   the well bias controller includes a second p-channel MOSFET having a source connected to the rail, a gate connected to the output side of the pass transistor, and a drain and an n-well connected to the node.

10. The receiver circuit of claim 9 wherein the first p-channel MOSFET is on when a voltage potential at the output side of the pass transistor is below $V_{DD}$ and off when the voltage potential at the output side of the pass transistor is above $V_{DD}$.

11. The receiver circuit of claim 10 wherein the node tracks the voltage potential on the output side of the pass transistor.

12. The receiver circuit of claim 11 wherein the pass transistor is an n-channel MOSFET.

13. The receiver circuit of claim 12 further comprising:
   a ground terminal;
   a resistor connected between the gate of the second p-channel MOSFET and the drain of the first p-channel MOSFET; and
   a clamping transistor connected between the drain of the first p-channel MOSFET and the ground terminal.

14. The receiver circuit of claim 13 wherein the clamping transistor is an n-channel MOSFET having a gate and a source connected to the ground terminal and a drain connected to the drain of the first p-channel MOSFET.

15. A receiver circuit in an electrostatic discharge (ESD) environment comprising:
   a pass transistor having an input side receiving a signal, an output side, and a gate, the pass transistor susceptible to damage when an ESD potential is present;
   a receiver coupled to the output side of the pass transistor for receiving the signal;
   a first protection circuit having (a) a first rail providing an operating voltage potential to the gate of the pass transistor, and (b) means for electrically decoupling the first rail from the gate of the pass transistor;
   a second protection circuit having (a) test enable means for providing a test signal voltage to the output side of the pass transistor, and (b) means for electrically decoupling the output side of the pass transistor;

wherein the first protection circuit provides (1) the operating voltage potential to the gate when an ESD potential is not present, and (2) a voltage which tracks the ESD potential when the ESD potential is present at the input side of the pass transistor; and the second protection circuit provides (1) the test signal voltage to the output side of the pass transistor when an ESD potential is not present, and (2) a voltage which tracks the ESD potential when the ESD potential is present at the input side of the pass transistor.

16. The receiver circuit of claim 15 wherein:

the first protection circuit includes:
(a) a second rail and a third rail,
(b) a first node,
(c) a first p-channel MOSFET having a source connected to the second rail, a drain connected to the first rail, a gate connected to the first rail, and an n-well connected to the first node,
(d) a second p-channel MOSFET having a source connected to the first rail, a drain and a gate connected to the third rail, and an n-well connected to the first node, and
(e) a third p-channel MOSFET having a drain and an n-well connected to the first node, a source connected to the second rail, and a gate connected to the first rail; and the second protection circuit includes:
(f) a fourth rail,
(g) a test pin providing a test enable signal,
(h) a second node,
(i) a fourth p-channel MOSFET having a source connected to the fourth rail, a drain connected to the output side of the pass transistor, a gate connected to the test pin, and an n-well connected to the second node, and
(j) a fifth p-channel MOSFET having a source connected to the fourth rail, a gate connected to the output side of the pass transistor, and a drain and an n-well connected to the second node.

17. The receiver circuit of claim 16 wherein the pass transistor is an n-channel MOSFET.

18. The receiver circuit of claim 17 further comprising:
a ground terminal;
a resistor connected between the gate of the fifth p-channel MOSFET and the drain of the fourth p-channel MOSFET; and
a clamping transistor connected between the drain of the fourth p-channel MOSFET and the ground terminal.

19. The receiver circuit of claim 18 wherein the clamping transistor is an n-channel MOSFET having a gate and a source connected to the ground terminal and a drain connected to the drain of the fourth p-channel MOSFET.

* * * * *